United States Patent
Tsukagoshi et al.

(10) Patent No.: US 9,716,190 B2
(45) Date of Patent: Jul. 25, 2017

(54) OPTICAL SENSOR DEVICE AND METHOD OF MANUFACTURING OPTICAL SENSOR DEVICE

(71) Applicant: SII Semiconductor Corporation, Chiba-shi, Chiba-ken (JP)

(72) Inventors: Koji Tsukagoshi, Chiba (JP); Noriyoshi Higashi, Osaka (JP)

(73) Assignee: SII Semiconductor Corporation (JP)

( * ) Notice: Subject to any disclaimer, the term of this patent is extended or adjusted under 35 U.S.C. 154(b) by 0 days.

(21) Appl. No.: 15/074,127

(22) Filed: Mar. 18, 2016

(65) Prior Publication Data
US 2016/0284875 A1  Sep. 29, 2016

(30) Foreign Application Priority Data

Mar. 23, 2015 (JP) ................................ 2015-059692
Mar. 3, 2016 (JP) ................................ 2016-041622

(51) Int. Cl.
*H01L 31/0203* (2014.01)
*H01L 31/02* (2006.01)
*H01L 31/18* (2006.01)
*C03C 3/095* (2006.01)

(52) U.S. Cl.
CPC .......... *H01L 31/0203* (2013.01); *C03C 3/095* (2013.01); *H01L 31/02002* (2013.01); *H01L 31/186* (2013.01)

(58) Field of Classification Search
CPC .......................... H01L 31/0203; C03C 3/095
See application file for complete search history.

(56) References Cited

U.S. PATENT DOCUMENTS

| | | | | |
|---|---|---|---|---|
| 2004/0248337 A1* | 12/2004 | Yan | .......................... | C08K 3/40 438/64 |
| 2006/0164959 A1* | 7/2006 | Kamei | ..................... | G11B 7/13 369/120 |
| 2011/0215366 A1* | 9/2011 | Tsukagoshi | ............. | H01L 33/62 257/99 |

FOREIGN PATENT DOCUMENTS

JP         2004179258         6/2004

* cited by examiner

*Primary Examiner* — Marc Armand
*Assistant Examiner* — Sarah Salerno
(74) *Attorney, Agent, or Firm* — Adams & Wilks

(57) ABSTRACT

An optical sensor device comprises an element-mounting portion, an optical sensor element provided on the element-mounting portion, a lead having a first contact region connected to the optical sensor element and a second contact region for an external connection, and a resin-encapsulating portion which covers at least a light-receiving plane of the optical sensor element. The resin-encapsulating portion comprises a resin and a glass filler including borosilicate glass dispersed in the resin. The transmissivity of the resin-encapsulating portion in one example is equal to or more than 40% in a wavelength range between 300 nm to 400 nm, and in another example is equal to or more than 60% in a wavelength range between 300 nm and 350 nm.

13 Claims, 6 Drawing Sheets

OPTICAL SENSOR DEVICE AND METHOD OF MANUFACTURING OPTICAL SENSOR DEVICE

TECHNICAL FIELD OF THE INVENTION

The present invention relates to an optical sensor device and a method of manufacturing an optical sensor device.

Priority is claimed on Japanese Patent Application No. 2015-059692, filed on Mar. 23, 2015 and Japanese Patent Application No. 2016-041622, filed on Mar. 3, 2016, the contents of which are incorporated herein by reference.

RELATED ART

Ultraviolet light is a representative factor which may have an adverse effect on the human body. Since ultraviolet light contains a wavelength range having an adverse effect on skin or the eyes, much information regarding human body protection and reduction in the adverse effect on the human body has been reported. The field of products having a function of preventing damage to health in advance or a function of assisting in prevention will attract more attention in the future, and a significant expansion of the field can be expected. In particular, sensors using a semiconductor have been widely used and can perform detection in response to ultraviolet light. Thus, semiconductor ultraviolet sensors have also been produced. For example, Patent Document 1 describes an ultraviolet sensor package.

[Patent Document 1] Japanese Unexamined Patent Application, First Publication No. 2004-179258

However, in the ultraviolet sensor disclosed in Patent Document 1, ultraviolet transmission characteristics are not stable, and high reliability cannot be obtained.

SUMMARY OF THE INVENTION

An object of the present invention is to provide an optical sensor device which solves the above-described problems and a method of manufacturing the optical sensor device.

In order to solve the above-described problems and to achieve the object, the present invention adopts the following configurations.

(a) An optical sensor device according to an aspect of the present invention includes an element-mounting portion, an optical sensor element provided on the element-mounting portion, a lead having a first contact region connected to the optical sensor element and a second contact region for an external connection, and a resin-encapsulating portion which covers at least a light-receiving plane of the optical sensor element. The resin-encapsulating portion includes a resin and a glass filler including borosilicate glass dispersed in the resin. The transmissivity of the resin-encapsulating portion is equal to or more than 40% in a wavelength range of 300 nm to 400 nm.

(b) In the optical sensor device according to (a), at least a part of the element-mounting portion may be exposed from the resin-encapsulating portion.

(c) The optical sensor device according to (a) or (b) may further include a mounting substrate portion provided on a side opposite to the light-receiving plane of the optical sensor element.

(d) The optical sensor device according to (c) may adopt a configuration in which the lead and the element-mounting portion are embedded into the mounting substrate portion, and in which the first contact region of the lead, the second contact region of the lead, and a placement surface of the element-mounting portion are exposed from the mounting substrate portion.

(e) The optical sensor device according to (d) may adopt a configuration in which the first contact region of the lead is exposed from a first surface of the mounting substrate portion on the optical sensor element side, and in which the second contact region of the lead is exposed from a second surface of the mounting substrate portion opposite to the first surface.

(f) In the optical sensor device according to (d) or (e), a surface of the element-mounting portion opposite to the placement surface may be exposed from the mounting substrate portion.

(g) In the optical sensor device according to any one of (c) to (f), the mounting substrate portion may include a ceramic or a printed circuit board.

(h) The optical sensor device according to any one of (c) to (e) may adopt a configuration in which the mounting substrate portion is provided on the same side as the light-receiving plane side of the optical sensor element, and in which the mounting substrate portion on the light-receiving plane side has a cavity whose diameter enlarges in a light-receiving direction of the optical sensor element from the element-mounting portion.

(i) In the optical sensor device according to any one of (a) to (h), the transmissivity of the resin-encapsulating portion may be equal to or more than 60% in a wavelength range of 300 nm to 350 nm.

(j) In the optical sensor device according to any one of (a) to (i), a composition of the borosilicate glass may satisfy the following conditions (1) to (10) in terms of % by weight in a range where a total weight of the borosilicate glass is 100% by weight:

(1) a weight ratio of $SiO_2$ is 60% to 70%;
(2) a weight ratio of $B_2O_3$ is 5% to 20%;
(3) a weight ratio of $Sb_2O_3$ is 1% to 5%;
(4) a total weight ratio of $Al_2O_3$, $La_2O_3$, and $Y_2O_3$ is 3% to 10%;
(5) a total weight ratio of ZnO, MgO, CaO, and SrO is 5% to 15%;
(6) a total weight ratio of $Li_2O$, $Na_2O$, and $K_2O$ is 10% to 30%;
(7) a weight ratio of CuO is 1% to 5%;
(8) a weight ratio of $TiO_2$ is 1% to 5%;
(9) a weight ratio of $Co_2O_3$ is 1% to 5%; and
(10) a weight ratio of NiO is 1% to 5%.

(k) In the optical sensor device according to any one of (a) to (i), a composition of the borosilicate glass may satisfy the following conditions (11) to (19) in terms of % by weight in a range where a total weight of the borosilicate glass is 100% by weight:

(11) a weight ratio of $SiO_2$ is 50% to 70%;
(12) a weight ratio of BaO is 10% to 30%;
(13) a weight ratio of $B_2O_3$ is 1% to 5%;
(14) a weight ratio of $Sb_2O_3$ is 1% to 5%;
(15) a total weight ratio of $Al_2O_3$, $La_2O_3$, and $Y_2O_3$ is 5% to 10%;
(16) a total weight ratio of $Li_2O$, $Na_2O$, and $K_2O$ is 10% to 20%;
(17) a weight ratio of CuO is 1% to 5%;
(18) a weight ratio of $Co_2O_3$ is 1% to 5%; and
(19) a weight ratio of NiO is 1% to 10%.

(l) In the optical sensor device according to any one of (a) to (k), a particle size of the glass filler may be 0.5 µm to 20.0 µm.

(m) A method of manufacturing an optical sensor device according to another aspect of the present invention is a method of manufacturing the optical sensor device according to any one of (a) to (l), the method including: a step of preparing the glass filler by crushing borosilicate glass which has a transmissivity of equal to or more than 40% in a wavelength range of 300 nm to 400 nm, to prepare the glass filler; and a step of sealing a periphery of the optical sensor element by a transfer molding method using a tablet formed with a mixture of the glass filler and a resin.

According to the respective aspects of the present invention, an optical sensor device having stable ultraviolet transmission characteristics and high reliability, and a method of manufacturing the optical sensor device can be provided.

EMBODIMENTS OF THE INVENTION

Figure 1:
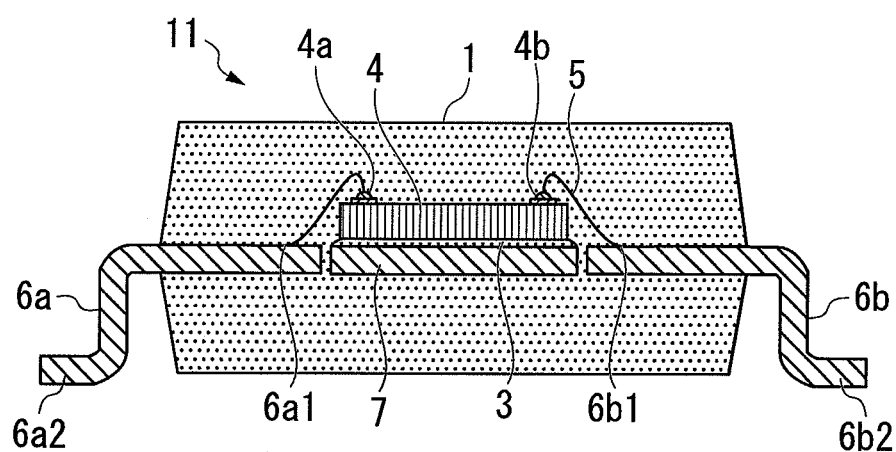
FIG. 1 is a longitudinal sectional view schematically showing a configuration of an optical sensor device according to a first embodiment of the present invention.

Hereinafter, an optical sensor device and a method of manufacturing an optical sensor device according to the present invention will be described in detail appropriately with reference to the drawings.

In the drawings used for the following description, for convenience of easy understanding of characteristics, distinctive portions may be enlarged and shown, and a dimensional ratio between the respective components is not necessarily the same as the actual dimension ratio.

First Embodiment

FIG. 1 is a longitudinal sectional view schematically showing an optical sensor device 11 according to the embodiment.

The optical sensor device 11 includes an element-mounting portion 7, an optical sensor element 4, leads 6a and 6b, wires 5, and a resin-encapsulating portion 1.

The optical sensor element 4 is placed on a top surface of the element-mounting portion 7. The optical sensor element 4 is attached to the top surface of the element-mounting portion 7 through a die attach material 3. Typically, the element-mounting portion 7 is formed of the same material as that of the leads 6a and 6b and is also called a die pad.

The optical sensor element 4 receives light and converts the received light into an electric signal. Electrodes 4a and 4b are provided on the top surface of the optical sensor element 4.

The leads 6a and 6b connect the optical sensor element 4 and an external device (not shown). The electric signal is sent to the external device through the leads 6a and 6b.

The electrode 4a provided on the optical sensor element 4 is electrically connected to the lead 6a through one of the pair of wires 5. Likewise, the electrode 4b provided on the optical sensor element 4 is electrically connected to the lead 6b through the other one of the pair of wires 5. Contact regions of the leads 6a and 6b on a side close to the optical sensor element 4 will be referred to as first contact regions 6a1 and 6b1, and contact regions of the leads 6a and 6b which function as external terminals connected to the external device will be referred to as second contact regions 6a2 and 6b2. The second contact regions 6a2 and 6b2 are exposed to the outside of the resin-encapsulating portion 1 described below and function as the external terminals.

The resin-encapsulating portion 1 is an external package which covers at least a light-receiving plane (top surface) of the optical sensor element 4.

The resin-encapsulating portion 1 according to the embodiment covers the optical sensor element 4, the element-mounting portion 7, the wires 5, and a part of the leads 6a and 6b connected to the optical sensor element 4 through the wires 5.

The resin-encapsulating portion 1 contains a resin and a glass filler. The glass filler is made by crushing borosilicate glass having ultraviolet transmission characteristics by composition adjustments. The glass filler is dispersed in a resin.

It is preferable that a particle size of the glass filler is in a range of 0.5 μm to 20.0 μm. When the particle size of the glass filler is in this range, the dispersibility of the glass filler in the resin can be improved. The dispersibility described herein indicates the degree to which the glass filler is scattered in the entire region of the resin portion.

The particle size of the glass filler can be measured using a laser diffraction/scattering method. In the laser diffraction/scattering method, the glass filler, which is a moving measurement target, is irradiated with laser light, and the particle size of the glass filler is measured based on a light intensity and a light distribution in a diffraction/scattering image obtained when the glass filler passes through an optical path of the laser light. Specifically, the particle size can be measured by allowing the glass filler to freely fall and irradiating the falling glass filler with laser light.

As the resin of the resin-encapsulating portion 1, a light-transmitting resin can be used. As the resin, for example, an epoxy resin, a silicon resin, an acrylic resin, a urethane resin, a melamine resin, an urea resin, a phenol resin, a fluororesin, or a mixture thereof, or polyamide, polycarbonate, or polystyrene can be used.

Light in an ultraviolet wavelength range of 300 nm to 400 nm passes through the resin-encapsulating portion 1 at a relatively high transmissivity. The relatively high transmissivity described herein refers to a transmissivity of at least 40%

In one example, a composition of the borosilicate glass (resin-encapsulating portion 1) having a transmissivity in the above-described range satisfies the following conditions (1) to (10) in terms of % by weight in a range where a total weight of the borosilicate glass is 100% by weight:

(1) a weight ratio of $SiO_2$ is 60% to 70%;
(2) a weight ratio of $B_2O_3$ is 5% to 20%;
(3) a weight ratio of $Sb_2O_3$ is 1% to 5%;
(4) a total weight ratio of $Al_2O_3$, $La_2O_3$, and $Y_2O_3$ is 3% to 10%;
(5) a total weight ratio of ZnO, MgO, CaO, and SrO is 5% to 15%;
(6) a total weight ratio of $Li_2O$, $Na_2O$, and $K_2O$ is 10% to 30%;
(7) a weight ratio of CuO is 1% to 5%;
(8) a weight ratio of $TiO_2$ is 1% to 5%;
(9) a weight ratio of $Co_2O_3$ is 1% to 5%; and
(10) a weight ratio of NiO is 1% to 5%.

In another example, a composition of the borosilicate glass (resin-encapsulating portion 1) having a transmissivity in the above-described range satisfies the following conditions (11) to (19) in terms of % by weight in a range where a total weight of the borosilicate glass is 100% by weight:

(11) a weight ratio of $SiO_2$ is 50% to 70%;
(12) a weight ratio of BaO is 10% to 30%;
(13) a weight ratio of $B_2O_3$ is 1% to 5%;
(14) a weight ratio of $Sb_2O_3$ is 1% to 5%;
(15) a total weight ratio of $Al_2O_3$, $La_2O_3$, and $Y_2O_3$ is 5% to 10%;
(16) a total weight ratio of $Li_2O$, $Na_2O$, and $K_2O$ is 10% to 20%;
(17) a weight ratio of CuO is 1% to 5%;
(18) a weight ratio of $Co_2O_3$ is 1% to 5%; and
(19) a weight ratio of NiO is 1% to 10%.

Regarding borosilicate glasses which satisfy the above-described conditions (Examples A and B relating to the resin-encapsulating portion 1) and borosilicate glasses which do not satisfy the above-described conditions (Comparative Examples 1 and 2), ultraviolet transmission characteristics and reliability were measured, and the results thereof are shown in Table 1.

TABLE 1

| Composition/ Addition Amount (%) | Example A | Example B | Comparative Example 1 | Comparative Example 2 |
| --- | --- | --- | --- | --- |
| $SiO_2$ | 60 to 70 | 50 to 70 | 50 to 70 | 40 to 60 |
| BaO | — | 10 to 30 | — | — |
| $B_2O_3$ | 5 to 20 | 1 to 5 | 10 to 25 | 5 to 20 |
| $Sb_2O_3$ | 1 to 5 | 1 to 5 | 1 to 5 | 1 to 5 |
| $Al_2O_3$ + $La_2O_3$ + $Y_2O_3$ | 3 to 10 | 5 to 10 | 1 to 5 | 1 to 5 |
| ZnO + MgO + CaO + SrO | 5 to 15 | — | 1 to 10 | — |
| $Li_2O$ + $Na_2O$ + $K_2O$ | 10 to 30 | 10 to 20 | 10 to 30 | 10 to 30 |
| CuO | 1 to 5 | 1 to 5 | 1 to 5 | 1 to 5 |
| $TiO_2$ | 1 to 5 | — | 1 to 5 | 1 to 5 |
| $CeO_2$ | — | — | 1 to 5 | — |
| $Co_2O_3$ | 1 to 5 | 1 to 5 | 1 to 5 | 1 to 5 |
| NiO | 1 to 5 | 1 to 10 | 1 to 5 | 1 to 5 |

TABLE 1-continued

| Composition/ Addition Amount (%) | Example A | Example B | Comparative Example 1 | Comparative Example 2 |
| --- | --- | --- | --- | --- |
| Ultraviolet transmission characteristics | ○ (good) | ○ (good) | ○ (good) | Δ (mediocre) |
| Reliability (Weather Resistance) | ○ (good) | ○ (good) | Δ (mediocre) | x (poor) |

In the compositions of the Examples A and B, both ultraviolet transmission characteristics and reliability (weather resistance) were satisfactory. On the other hand, in the composition of Comparative Example 1, ultraviolet transmission characteristics were satisfactory, but reliability was slightly low. In the composition of Comparative Example 2, both ultraviolet transmission characteristics and reliability were less satisfactory than those of Example A.

Figure 9:
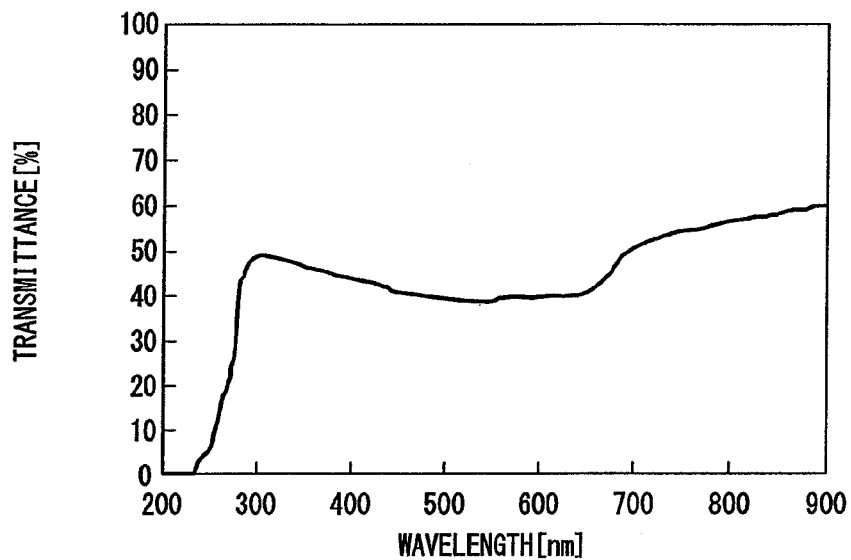
FIG. 9 is a diagram showing the spectral characteristics of an optical sensor device according to Example A of the present invention.
Figure 11:
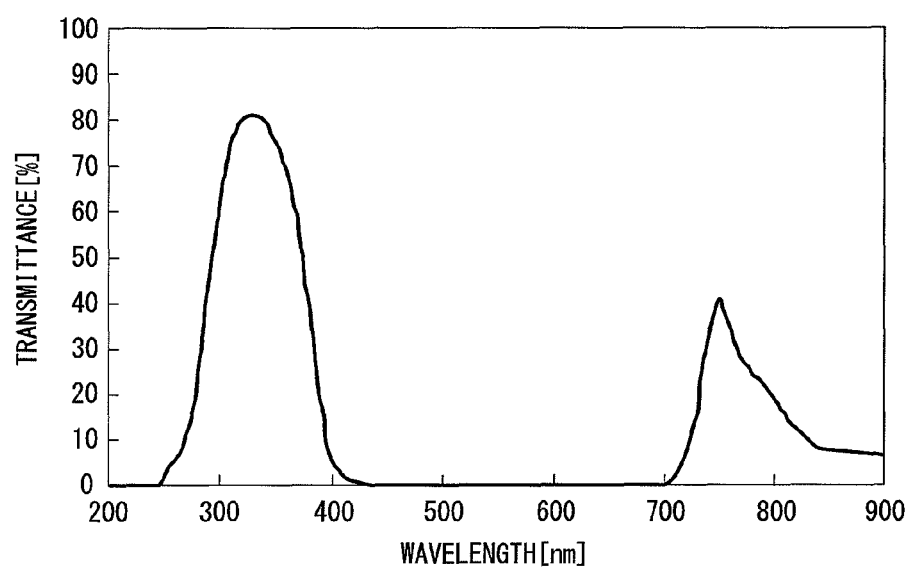
FIG. 11 is a diagram showing the spectral characteristics of an optical sensor device according to Example B of the present invention.

Hereinafter, regarding each of a case where the resin-encapsulating portion 1 of Example A was used and a case where the resin-encapsulating portion 1 having the composition of Example B was used, the spectral transmission characteristics of the optical sensor device 11 were measured, and the results will be shown. FIG. 9 is a diagram showing the spectral characteristics of the optical sensor device 11 according to Example A. FIG. 11 is a diagram showing the spectral characteristics of the optical sensor device 11 according to Example B. In FIGS. 9 and 11, the horizontal axis represents the wavelength (nm), and the vertical axis represents the transmissivity (%).

As shown in FIG. 9, the transmissivity of the resin-encapsulating portion 1 having the composition of Example A is equal to or more than 40% in an ultraviolet wavelength range of 300 nm to 400 nm. That is, the weather resistance is high. This effect is also verified in the investigation of Table 1.

In addition, as shown in FIG. 11, the resin-encapsulating portion 1 having the composition of Example B has a transmissivity of equal to or more than 60% in an ultraviolet wavelength range of 300 nm to 350 nm. That is, the weather resistance is high. This effect is also verified in the investigation of Table 1.

The function of each component in Examples A and B will be described below.

The amounts of $SiO_2$, BaO, $B_2O_3$, and $Sb_2O_3$ (the conditions (1) to (3) in Example A and the conditions (11) to (14) in Example B) relate to the formation of a main structure of the glass. The components have an effect on the entire shape of the spectral transmission characteristics and are one of the determining factors for reliability and weather resistance.

$SiO_2$ constitutes a main structure of the glass and contributes most to the improvement of reliability. BaO, $B_2O_3$, and $Sb_2O_3$ constitute auxiliary structures of the glass.

BaO has an effect on a sharp rise of the spectral transmission characteristics in the ultraviolet wavelength range. Examples B to which BaO was added shows a sharp rise of the transmission spectrum in the ultraviolet wavelength range.

$B_2O_3$ has an effect on reliability, in particular, weather resistance. As the addition amount of $B_2O_3$ increases, the reliability deteriorates. In Example B, the addition amount of $B_2O_3$ was less than that in Example A, and the reliability was high.

$Sb_2O_3$ has an effect on reliability, in particular, weather resistance.

In addition, the total amount of $Al_2O_3$, $La_2O_3$, and $Y_2O_3$ (the condition (4) of Example A and the condition (15) of Example B), the total amount of ZnO, MgO, CaO, and SrO (the condition (5) of Example A), and the total amount of $Li_2O$, $Na_2O$, and $K_2O$ (the condition (6) of Example A and the condition (16) of Example B) relate to the adjustment of the transmissivity of the mixture of the resin and the glass filler. These components relate to the fine adjustment of the characteristics. By finely adjusting the mixing amounts according to characteristics required for the resin, a decrease in transmissivity of the mixture of the resin and the glass filler can be prevented.

Finally, the amounts of CuO, $TiO_2$, $Co_2O_3$, and NiO (the conditions (7) to (10) of Example A and the conditions (17) to (19) of Example B) relate to the control of transmission and absorption of visible light.

For example, Ti and Ce are not incorporated into Example B. Thus, the absorption of visible light increases, the ultraviolet light transmission spectrum has a shape having a narrow spectral width in which transmission characteristics are not shown in the visible light wavelength range.

(Manufacturing Method)

Hereinafter, a method of manufacturing the optical sensor device according to the embodiment will be described. The method of manufacturing the optical sensor device according to the embodiment includes a step of preparing a glass filler; and a step of sealing a periphery of the optical sensor element 4 with a mixture of the glass filler and a resin.

The glass filler is obtained, for example, by refining coarsely crushed glass using a jet mill or the like. The coarsely crushed glass has various particle sizes. By causing glass particles to collide against each other using a jet mill or the like, the refined glass filler can be obtained. The particle size of the glass filler is measured using a laser diffraction/scattering method and is refined using a jet mill or the like until the particle size approaches a desired size. After it is verified that the particle size approaches a desired size when measured using a laser diffraction/scattering method, the glass filler is caused to pass through a mesh having a predetermined size to obtain a desired particle size.

It is preferable that glass before crushing is prepared in a reducing atmosphere. By preparing the glass in a reducing atmosphere, the transmissivity of the glass can be improved.

The crushed glass filler is mixed and kneaded with the resin and is formed into a paste or a slurry after defoaming and compatibilization. As a result, a liquid resin composition into which the glass filler is incorporated is obtained. A lead frame or a substrate including the element-mounting portion on which the optical sensor element 4 is mounted is set on a resin sealing mold. Next, the resin with the glass filler in a liquid state is filled into the resin sealing mold and is cured, thereby obtaining a package.

In the above process, as an example of the manufacturing method, glass having ultraviolet transmission characteristics is crushed to prepare a glass filler, the prepared glass filler is dispersed in a resin to obtain a mixture, the obtained mixture is formed into a tablet, and the periphery of the optical sensor element 4 is sealed with the tablet using a transfer molding method. As a result, the resin-encapsulating portion 1 can be formed.

Hereinafter, the effects of the embodiment will be explained in comparing the embodiment to an example of the related art.

Figure 10:
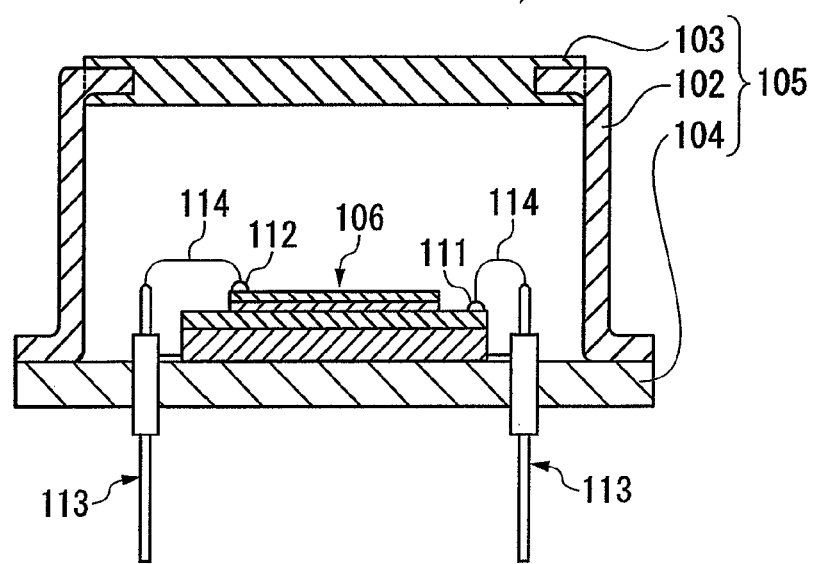
FIG. 10 is a longitudinal sectional view schematically showing a configuration of an optical sensor device in the related art.

FIG. 10 is an exemplary sectional view showing an ultraviolet sensor package (optical sensor device 101) disclosed in Patent Document 1. A lead 113 insulated by glass or the like is fixed to a metal stem 104 as a terminal. One end of the lead 113 is exposed to a surface of the metal stem 104. A light-receiving element 106 formed of a semiconductor is mounted on the metal stem 104. Electrodes 111 and 112 provided on a top surface of the light-receiving element 106 are electrically connected to the exposed end of the lead 113 through a metal wire 114.

A cap 102 formed of the same metal material as the metal stem 104 is attached on the metal stem 104. An opening is formed at the center of the cap 102. A disk 103 formed of Kovar glass was fixed to the opening. The disk 103 formed of Kovar glass has a characteristic of allowing the transmission of ultraviolet light. External light is incident on the light-receiving element 106 through the disk 103. An electromotive force generated in the light-receiving element 106 is sent to an external connection terminal or the like (not shown) through the wire 114 and the lead 113.

The light-receiving element 106 has a characteristic in which the sensitivity is present in an ultraviolet wavelength range. The light-receiving element 106 can detect ultraviolet light contained in light which is incident on the light-receiving element through the disk 103 formed of Kovar glass.

In the optical sensor device 101 disclosed in Patent Document 1, the metal stem 104 and the cap 102 are separately provided. However, it is necessary to attach the metal stem 104 and the cap 102 to each other seamlessly. In order to provide an external lead terminal, it is necessary to form an opening on the metal stem 104, to embed the lead 113 into the opening, and to fix the components by melting through glass or the like. In addition, it is necessary to form an opening by denting the center of the cap 102. In addition, it is necessary to embed Kovar glass into the opening.

Since the Kovar glass (disk 103) is small and disk-shaped, much time and effort is required for the processing and embedding. It is necessary to perform the processing and assembly separately for each component, and as the costs increase, such a package structure requires much time and effort for the assembly.

Therefore, in the optical sensor device 101 disclosed in Patent Document 1, reduction in the size and thickness is difficult, and thus it is difficult to change the design significantly. In recent semiconductor packages requiring portability, reduction in the size and thickness is required in many cases. However, it is difficult to sufficiently reduce the size and thickness of the metal stem 104 and the cap 102. In addition, it is more difficult to form an opening on the metal stem 104 and to embed a lead terminal thereinto, and it is more difficult to process the Kovar glass (disk 103) into a small size and to embed the Kovar glass. The costs also increase.

The optical sensor device 101 disclosed in Patent Document 1 has a light-transmitting window (disk 103) formed of Kovar glass that is formed at the center of the metal cap 102. The Kovar glass is fixed in a direction above the light-receiving element 106. The light-receiving element 106 can detect light which is incident in the direction above the light-receiving element 106 and cannot detect light which is incident in a direction oblique to the light-receiving element 106. Therefore, directional angle characteristics are narrow in a detection range.

On the other hand, focusing on only reduction in the size and thickness, a semiconductor package structure is known. The semiconductor package structure has a structure in which a semiconductor element is sealed by resin molding. For example, a package in which a metal lead terminal and an element-mounting portion are sealed by resin molding, or a package in which an interconnect is provided on a printed circuit board or a ceramic substrate having heat resistance to form an external connection terminal or an element-mounting portion is known. Regarding this resin-sealed package, reduction in the size and thickness can be performed. By providing a material configuration, facilities, and an assembly method suitable for mass production, an increase in the costs can be suppressed.

However, in order to receive external light through a package using a resin sealing structure, it is necessary to use a transparent epoxy resin having high light transmissivity. However, the transparent epoxy resin having high light transmissivity is weak to heat, moisture, and ultraviolet light. In addition, when the resin is decomposed by heat, the resin is discolored. Since the discoloration causes light absorption, the light transmissivity deteriorates. In this case, external incident light is attenuated in the resin, the intensity of light received by the light-receiving element decreases, which leads to a decrease in the light receiving sensitivity. By continuously being exposed to heat, the resin becomes embrittled, and defects such as cracking or peeling occur, which leads to the malfunction or breakage of the package.

On the other hand, in the optical sensor device 11 according to the embodiment, the sealing structure in which the glass filler formed of borosilicate glass is dispersed in the resin is adopted. As a result, although the sealing structure is a resin sealing structure, ultraviolet light in a wavelength range of 300 nm to 400 nm where ultraviolet rays cannot pass under normal conditions can pass through the sealing structure at a transmissivity of equal to or more than 40% (refer to Example A). In addition, depending on the material composition, the transmissivity in a ultraviolet wavelength range of 300 nm to 350 nm can be controlled to be equal to or more than 60%.

In addition, by dispersing the glass filler in the resin, the expansion coefficient of the resin can be reduced by equal to or more than 30% compared to that of the related art. Further, the borosilicate glass has not only heat resistance but also high reliability such as weather resistance to a high-temperature high-humidity environment. Therefore, a package which includes a resin sealing structure having high reliability can be obtained.

In addition, by adopting the resin sealing structure, the size and thickness of the optical sensor device 11 can be reduced. The manufacturing of the resin sealing structure is simple and can be realized at a low cost.

In addition, in the optical sensor device 11 according to the embodiment, light having ultraviolet transmission characteristics can be obtained from light which is incident not only in a direction above the optical sensor element 4 but also in a direction oblique to the optical sensor element 4. Accordingly, since the angle range of incident light which can be received is wide, the optical sensor device 11 having a wide directional angle can be realized.

Since the resin sealing structure does not have a cavity above the element-mounting portion 7, the periphery of the optical sensor element 4 mounted on a lead frame or a substrate can be sealed with the resin. In the lead frame, a lead frame obtained by performing metallization on metal or a resin can be used. As the substrate, a substrate formed of a resin, a ceramic, metal, glass, or silicon can be used. Further, in order to obtain the resin sealing structure having a cavity, the periphery of the optical sensor element 4 mounted on a lead frame or a substrate can be filled with the resin.

Second Embodiment

Figure 2:
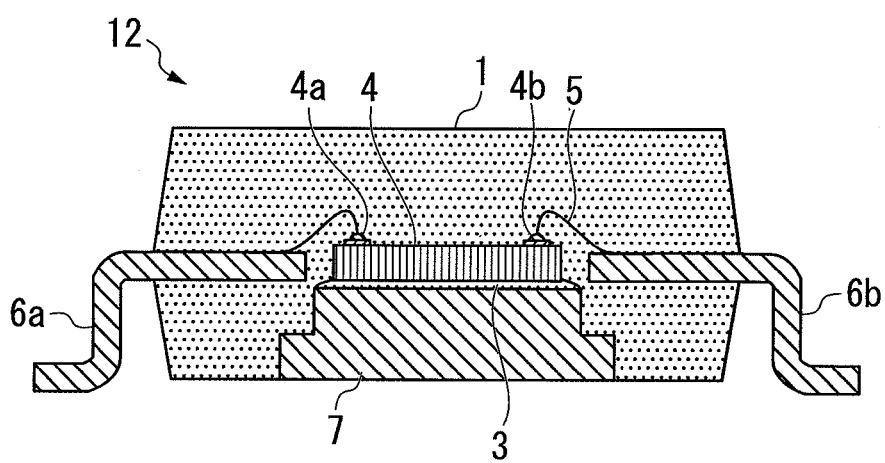
FIG. 2 is a longitudinal sectional view schematically showing a configuration of an optical sensor device according to a second embodiment of the present invention.

FIG. 2 is a longitudinal sectional view showing an optical sensor device 12 according to a second embodiment of the present invention. The shape of the element-mounting portion 7 in the optical sensor device 12 is different from that in the optical sensor device 11 according to the above-described first embodiment.

The resin-encapsulating portion 1 is obtained by crushing glass having ultraviolet transmission characteristics to prepare a glass filler and dispersing the glass filler in a resin, and a part of the optical sensor element 4, the element-mounting portion 7, the wires 5, and the leads 6a and 6b are sealed with the resin-encapsulating portion 1 using a transfer molding method.

At least a part of the element-mounting portion 7 according to the second embodiment is exposed from the resin-encapsulating portion 1. The shape of the element-mounting portion 7 is not limited to that of the configuration shown in FIG. 2. Within a range where light can be received by the optical sensor element 4 without being blocked, the shape of the element-mounting portion 7 can be freely set.

Since a part of the element-mounting portion 7 is exposed from the resin-encapsulating portion 1, heat generated from the optical sensor element 4 can be easily discharged to the outside of the resin-encapsulating portion 1. That is, the lower thermal resistance optical sensor device 12 can be obtained.

Third Embodiment

Figure 3:
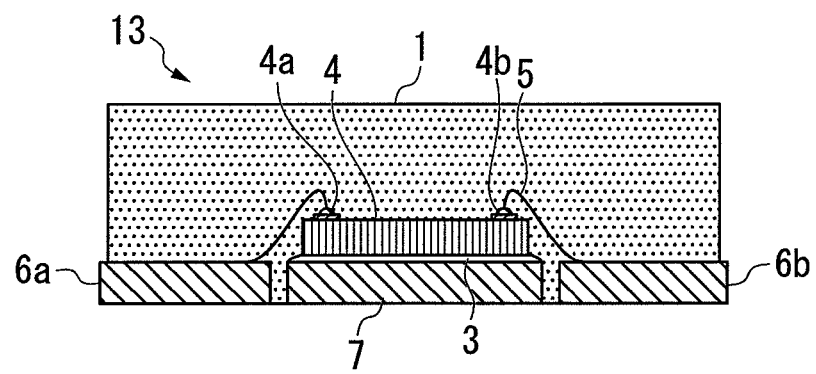
FIG. 3 is a longitudinal sectional view schematically showing a configuration of an optical sensor device according to a third embodiment of the present invention.

FIG. 3 is a longitudinal sectional view showing an optical sensor device 13 according to a third embodiment of the present invention. The optical sensor device 13 is the same as the optical sensor devices 11 and 12 according to the first and second embodiments, in that the resin-encapsulating portion 1 is formed using a transfer molding method by crushing glass having ultraviolet transmission characteristics to prepare a glass filler and dispersing the glass filler in a resin.

On the other hand, the optical sensor device 13 is different from the optical sensor device 11 according to the first embodiment, in that most part of the leads 6a and 6b are covered with the resin-encapsulating portion 1. That is, in the second embodiment, when the optical sensor device 13 is seen in a plan view, the dimension of the leads 6a and 6b substantially falls within that of the resin-encapsulating portion 1 without being significantly exposed from the resin-encapsulating portion 1. A part of side end surfaces of the leads 6a and 6b and a part of back surfaces (bottom surfaces) of the leads 6a and 6b are exposed from the resin-encapsulating portion 1 and function as external terminals.

The element-mounting portion 7 has the same thickness as the leads 6a and 6b. A surface of the element-mounting portion 7 opposite to a surface where the optical sensor element 4 is provided is exposed from the resin-encapsulating portion 1. As a result, heat generated from the optical sensor element 4 can be discharged to the outside of the resin-encapsulating portion 1, a low thermal resistance package can be obtained, and the size and thickness of the package can be reduced. In addition, in FIG. 3, the element-mounting portion 7 has the same thickness as the leads 6a and 6b. However, a structure may be adopted in which the element-mounting portion 7 has a smaller thickness than the leads 6a and 6b and is not exposed from the resin-encapsulating portion 1.

Fourth Embodiment

Figure 4:
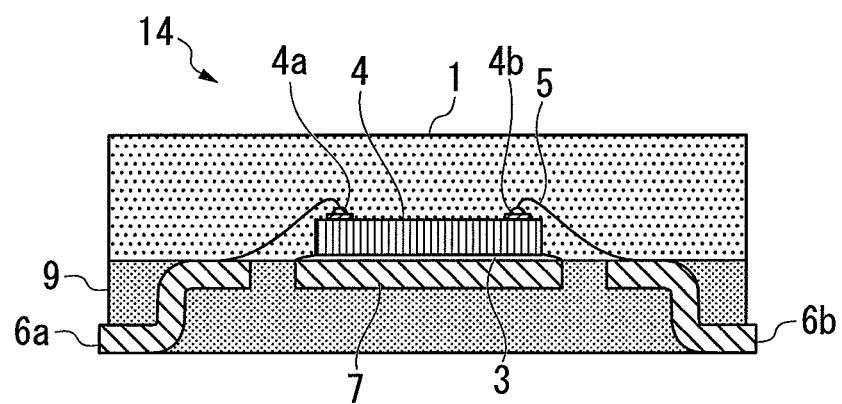
FIG. 4 is a longitudinal sectional view schematically showing a configuration of an optical sensor device according to a fourth embodiment of the present invention.

FIG. 4 is a longitudinal sectional view showing an optical sensor device 14 according to a fourth embodiment of the present invention. The optical sensor device 14 is the same as the optical sensor devices 11 to 13 according to the first to the third embodiments, in that the resin-encapsulating portion 1 is formed using a transfer molding method by crushing glass having ultraviolet transmission characteristics to prepare a glass filler and dispersing the glass filler in a resin.

On the other hand, the fourth embodiment is different from the first to third embodiments, in that a mounting substrate portion 9 is further provided on a side opposite to the light-receiving plane of the optical sensor element 4. In FIG. 4, the element-mounting portion 7 and the leads 6a and 6b are embedded into the mounting substrate portion 9 to be integrated. Therefore, the entire periphery of the optical sensor element 4 is not sealed with the resin-encapsulating portion 1, and the top portion of the mounting substrate portion 9 is sealed with the resin-encapsulating portion 1, the mounting substrate 9 being obtained by integrating the element-mounting portion 7 which the optical sensor element 4 is mounted on and the leads 6a and 6b whose side surfaces and bottom surfaces functioning as external terminals are exposed to each other.

For the mounting substrate 9, for example, a ceramic, a printed circuit board, or a resin is used as a base material. It is preferable that the printed circuit board which is formed of a base material having high heat resistance is used.

As the resin, an epoxy resin encapsulant which is filled with a silica filler and is used in a semiconductor integrated circuit, or a thermosetting or thermoplastic resin having high heat resistance can be preferably used.

The leads 6a and 6b and the element-mounting portion 7 are fixed to the mounting substrate portion 9 and thus have higher heat resistance as compared to the configuration of being fixed using the resin-encapsulating portion 1 and further have high strength and high weather resistance. The leads 6a and 6b are embedded into the mounting substrate portion 9 and have an external dimension so as to be accommodated in the mounting substrate portion 9. Thus, a package capable of reduction in the size and thickness can be obtained.

Fifth Embodiment

Figure 5:
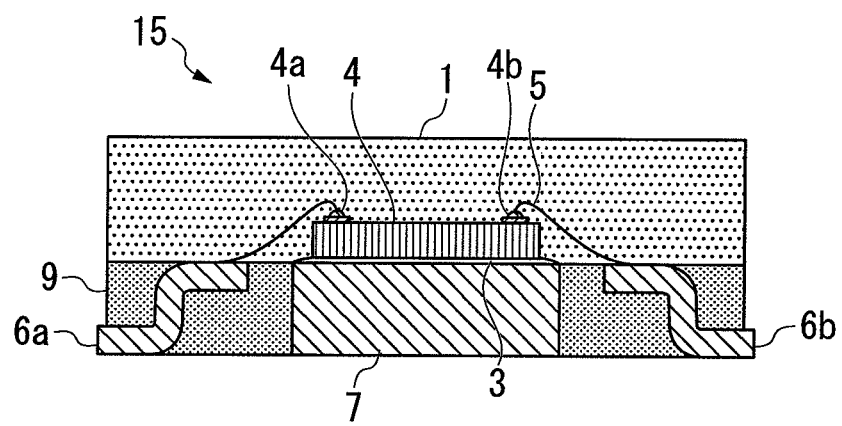
FIG. 5 is a longitudinal sectional view schematically showing a configuration of an optical sensor device according to a fifth embodiment of the present invention.

FIG. 5 is a longitudinal sectional view showing an optical sensor device 15 according to a fifth embodiment of the present invention. The optical sensor device 15 is the same as the optical sensor devices 11 to 14 according to the first to the fourth embodiments, in that the resin-encapsulating portion 1 is formed using a transfer molding method by crushing glass having ultraviolet transmission characteristics to prepare a glass filler and dispersing the glass filler in a resin.

On the other hand, the fifth embodiment is different from the first to fourth embodiments, in that the thickness of the element-mounting portion 7 in a cross-sectional direction (thickness direction) is increased, and a part of the element-mounting portion 7 is exposed from the mounting substrate portion 9. With the above-described configuration, heat generated from the optical sensor element 4 can be suitably discharged to the outside through the element-mounting portion 7. That is, the low thermal resistance optical sensor device 15 can be obtained.

Sixth Embodiment

Figure 6:
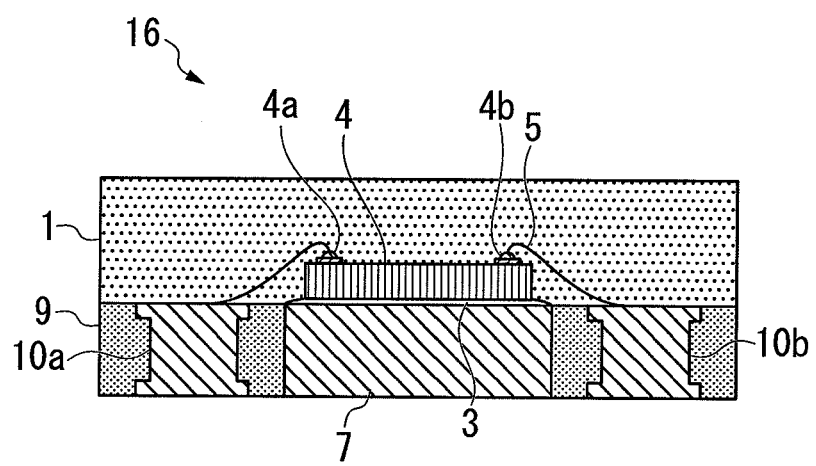
FIG. 6 is a longitudinal sectional view schematically showing a configuration of an optical sensor device according to a sixth embodiment of the present invention.

FIG. 6 is a longitudinal sectional view showing an optical sensor device 16 according to a sixth embodiment of the present invention. The shape of the resin-encapsulating portion 1 is the same as those of the fourth and fifth embodiments.

On the other hand, the shape of the leads 6a and 6b of the sixth embodiment is not the same as those of the fourth and fifth embodiments. In the optical sensor device 16 according to the sixth embodiment, leads, which are electrically connected to the electrodes 4a and 4b provided on the optical sensor element 4 through the wires 5, are through electrodes 10a and 10b.

By embedding the through electrodes 10a and 10b into the mounting substrate portion 9, the size and thickness of the optical sensor device 16 can be further reduced. In addition, as in the case of the fifth embodiment, the thickness of the element-mounting portion 7 in a cross-sectional direction (thickness direction) is increased, and a part of the element-mounting portion 7 is exposed from the mounting substrate portion 9. By exposing a part of the element-mounting portion 7, heat generated from the optical sensor element 4 can be discharged to the outside, and the low thermal resistance optical sensor device 16 can be obtained. On the other hand, depending on the intended use, a structure in which a part of the element-mounting portion 7 is not exposed may be adopted.

Seventh Embodiment

Figure 7:
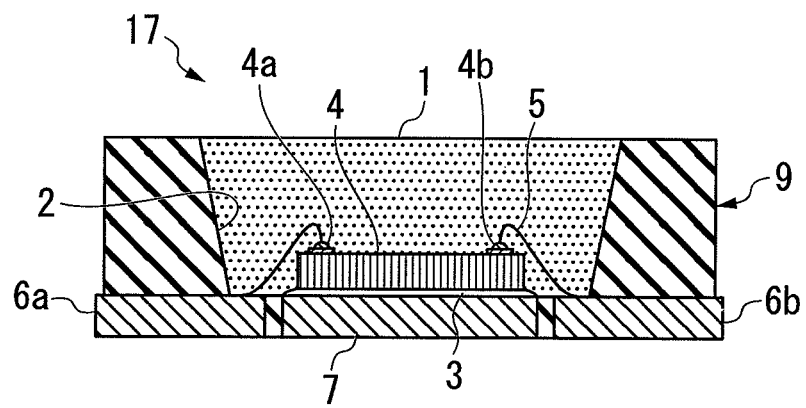
FIG. 7 is a longitudinal sectional view schematically showing a configuration of an optical sensor device according to a seventh embodiment of the present invention.

FIG. 7 is a longitudinal sectional view showing an optical sensor device 17 according to a seventh embodiment of the present invention.

In the optical sensor devices 14 to 16 according to the fourth to sixth embodiments, the mounting substrate portion 9 is provided on a back surface (bottom surface) opposite to the light-receiving plane (top surface) of the optical sensor element 4. On the other hand, in the optical sensor device 17 according to the seventh embodiment, the mounting substrate portion 9 is provided on the same surface as the light-receiving plane (top surface) of the optical sensor element 4. Further, when the mounting substrate portion 9 is seen in a longitudinal sectional view as shown in FIG. 7, the mounting substrate portion on the light-receiving plane side has a cavity 2 whose diameter enlarges in a light-receiving direction of the optical sensor element 4 from the element-mounting portion 7. This cavity 2 accommodates the optical sensor element 4 and has a truncated conical shape in which the diameter enlarges in a direction away from the optical sensor element 4. The shape of the cavity 2 is not limited to a truncated conical shape and it may have other shapes.

The optical sensor device 17 according to the seventh embodiment includes the mounting substrate portion 9 having the cavity 2, the leads 6a and 6b, the optical sensor element 4, the wires 5, the element-mounting portion 7, and the resin-encapsulating portion 1. The optical sensor element 4 is attached to the element-mounting portion 7 which forms the bottom surface of the cavity 2 of the mounting substrate portion 9, through the die attach material 3.

One end portion of each of the leads 6a and 6b is exposed in the bottom portion of the cavity 2, and the exposed end portions are electrically connected to the electrodes 4a and 4b provided on the top surface of the optical sensor element 4 through the wires 5. In addition, the other end portions of the leads 6a and 6b function as external terminals by penetrating through the mounting substrate portion 9 to be exposed to the outside. The cavity 2 is filled by potting with a resin in which a glass filler having ultraviolet transmission characteristics is dispersed, and this resin forms the resin-encapsulating portion 1 for sealing the cavity 2. Regarding the glass filler having ultraviolet transmission characteristics which is dispersed in the resin, borosilicate glass having the composition shown in the first embodiment can be used.

The mounting substrate portion 9 having the cavity 2 is formed of, for example, a resin or a ceramic having heat resistance. As a result, the optical sensor device 17 can be made to be a package having heat resistance, weather resistance, and high resistance to external impact. In addition, in a case where the optical sensor device 17 is seen in a longitudinal sectional view of FIG. 7, the entire distance between both ends of the region of the leads 6a and 6b is substantially the same as the width of the mounting substrate portion 9. In addition, in the leads 6a and 6b, end surfaces of the other end surfaces and the back surfaces are exposed to the outside and function as external terminals. The element-mounting portion 7 is formed of the same material as that of the leads 6a and 6b and has the same thickness as that of the leads 6a and 6b. A back surface of the element-mounting portion 7 is exposed from the mounting substrate portion 9 such that heat generated from the optical sensor element 4 can be discharged to the outside. As a result, the size and thickness of the optical sensor device 17 can be reduced, and a low thermal resistance package structure can be obtained.

Eighth Embodiment

Figure 8:
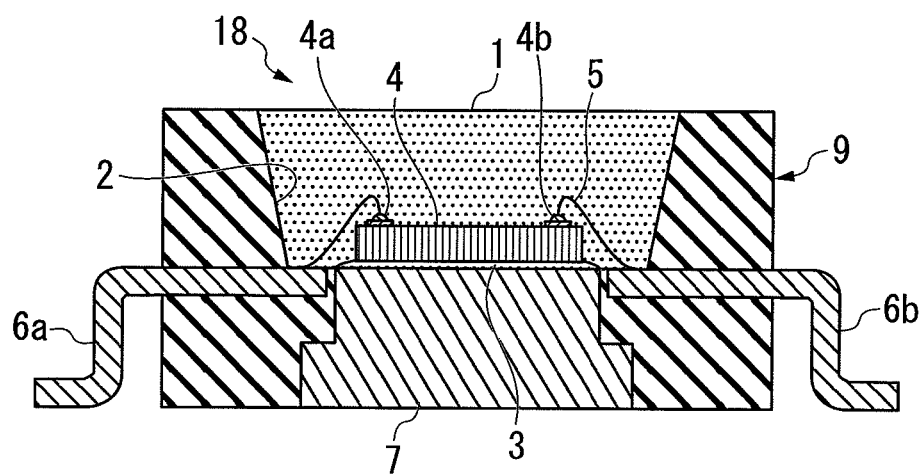
FIG. 8 is a longitudinal sectional view schematically showing a configuration of an optical sensor device according to an eighth embodiment of the present invention.

FIG. 8 is a longitudinal sectional view showing an optical sensor device 18 according to an eighth embodiment of the present invention.

The optical sensor device 18 is the same as the optical sensor devices according to the seventh embodiment, in that it includes the mounting substrate portion 9 having the cavity 2, the leads 6a and 6b, the resin-encapsulating portion 1 that is formed by filling and sealing the cavity 2 by potting with a resin in which the glass filler having ultraviolet transmission characteristics is dispersed, the optical sensor element 4, the element-mounting portion 7, and the wires 5. The eighth embodiment is different from the seventh embodiment, in that: the thicknesses of both of the element-mounting portion 7 formed of the same material as that of the leads 6a and 6b and the mounting substrate portion 9, in a cross-sectional direction shown in the longitudinal sectional view of FIG. 8, are increased; and a part of the element-mounting portion 7 is exposed from the back surface of the mounting substrate portion 9.

According to the above-described configuration, as shown in FIG. 8, the leads 6a and 6b penetrate through side portions of the mounting substrate portion 9 to be exposed to the outside. As a result, even in a case where the leads have a structure in which the end portions function as external terminals, heat generated from the optical sensor element 4 can be discharged to the outside, and thus a low thermal resistance package structure can be obtained. Further, the optical sensor device 18 can be made to be a package having heat resistance, weather resistance, and high resistance to external impact.

INDUSTRIAL APPLICABILITY

An optical sensor device according to an aspect of the present invention can be used in portable toys, simple healthcare products, wearable terminals, portable terminals, or home electric appliances. In addition, the optical sensor device can also be mounted on vehicles which are more easily affected by environments or apparatuses which are manufactured in consideration of outdoor use. Accordingly, the industrial applicability is high.

BRIEF DESCRIPTION OF THE REFERENCE SYMBOLS 11, 12, 13, 14, 15, 16, 17, 18: OPTICAL SENSOR DEVICE
1: RESIN-ENCAPSULATING PORTION
2: CAVITY
3: DIE ATTACH MATERIAL
4: OPTICAL SENSOR ELEMENT
4a, 4b: ELECTRODE
5: WIRE
6a, 6b: LEAD
6a1, 6b1: FIRST CONTACT REGION
6a2, 6b2: SECOND CONTACT REGION
7: ELEMENT-MOUNTING PORTION
9: MOUNTING SUBSTRATE PORTION
10a, 10b: THROUGH ELECTRODE

The invention claimed is:
1. An optical sensor device comprising:
an element-mounting portion;
an optical sensor element provided on the element-mounting portion;
a lead having a first contact region connected to the optical sensor element and a second contact region for an external connection; and
a resin-encapsulating portion covering at least a light-receiving plane of the optical sensor element, and including a resin and a glass filler, the resin-encapsulating portion having a transmissivity equal to or more than 40% in a wavelength range of 300 nm to 400 nm, the glass filler including borosilicate glass dispersed in the resin, and
a composition of the borosilicate glass satisfying the following conditions (1) to (10) in terms of % by weight in a range where a total weight of the borosilicate glass is 100% by weight:
(1) a weight ratio of $SiO_2$ is 60% to 70%;
(2) a weight ratio of $B_2O_3$ is 5% to 20%;
(3) a weight ratio of $Sb_2O_3$ is 1% to 5%;
(4) a total weight ratio of $Al_2O_3$, $La_2O_3$, and $Y_2O_3$, is 3% to 10%;
(5) a total weight ratio of ZnO, MgO, CaO, and SrO is 5% to 15%;
(6) a total weight ratio of $Li_2O$, $Na_2O$, and $K_2O$ is 10% to 30%;
(7) a weight ratio of CuO is 1% to 5%;
(8) a weight ratio of $TiO_2$ is 1% to 5%;
(9) a weight ratio of $Co_2O_3$ is 1% to 5%;
(10) a weight ratio of NiO is 1% to 5%.
2. The optical sensor device according to claim 1, wherein at least a part of the element-mounting portion is exposed from the resin-encapsulating portion.
3. The optical sensor device according to claim 1, further comprising a mounting substrate portion provided on a side opposite to the light-receiving plane of the optical sensor element.
4. The optical sensor device according to claim 3,
wherein the lead and the element-mounting portion are embedded into the mounting substrate portion, and
the first contact region of the lead, the second contact region of the lead and a placement surface of the element-mounting portion are exposed from the mounting substrate portion.

5. The optical sensor device according to claim 4,
wherein the first contact region of the lead is exposed from a first surface of the mounting substrate portion on the optical sensor element side, and
the second contact region of the lead is exposed from a second surface of the mounting substrate portion opposite to the first surface.

6. The optical sensor device according to claim 4, wherein a surface of the element-mounting portion opposite to the placement surface is exposed from the mounting substrate portion.

7. The optical sensor device according to claim 3, wherein the mounting substrate portion includes a ceramic or a printed circuit board.

8. The optical sensor device according to claim 3,
wherein the mounting substrate portion is provided on the same side as the light-receiving plane side of the optical sensor element, and
the mounting substrate portion on the light-receiving plane side has a cavity whose diameter enlarges in a light-receiving direction of the optical sensor element from the element-mounting portion.

9. The optical sensor device according to claim 1, wherein a particle size of the glass filler is 0.5 μm to 20.0 μm.

10. A method of manufacturing the optical sensor device according to claim 1, the method comprising:
a step of preparing the glass filler by crushing borosilicate glass which has a transmissivity of equal to or more than 40% in a wavelength range of 300 nm to 400 nm; and
a step of sealing a periphery of the optical sensor element by a transfer molding method using a tablet formed with a mixture of the glass filler and a resin.

11. An optical sensor device comprising:
an element-mounting portion;
an optical sensor element provided on the element-mounting portion;
a lead having a first contact region connected to the optical sensor element and a second contact region for an external connection; and
a resin-encapsulating portion covering at least a light-receiving plane of the optical sensor element, and including a resin and glass filler, the resin-=encapsulating portion having a transmissivity equal to or more than 60% in a wavelength range of 300 nm to 350 nm, the glass filler including borosilicate glass dispersed in the resin, and
a composition of the borosilicate glass satisfying the following conditions (11) to (19) in terms of % by weight in a range where a total weight of the borosilicate glass is 100% by weight:
(11) a weight ratio of $SiO_2$ is 50% to 70%;
(12) a weight ratio of BaO is 10% to 30%;
(13) a weight ratio of $B_2O_3$ is 1% to 5%;
(14) a weight ratio of $Sb_2O_3$ is 1% to 5%;
(15) a total weight ratio of $Al_2O_3$, $La_2O_3$, and $Y_2O_3$ is 5% to 10%;
(16) a total weight ratio of $Li_2O$, $Na_2O$, and $K_2O$ is 10% to 20%;
(17) a weight ratio of CuO is 1% to 5%;
(18) a weight ratio of $Co_2O_3$ is 1% to 5; and
(19) a weight ratio of NiO is 1% to 10%.

12. The optical sensor device according to claim 11, wherein a particle size of the glass filler is 0.5 μm to 20.0 μm.

13. A method of manufacturing the optical sensor device according to claim 11, the method comprising:
a step of preparing the glass filler by crushing borosilicate glass which has a transmissivity of equal to or more than 60% in a wavelength range of 300 nm to 350 nm; and
a step of sealing a periphery of the optical sensor element by a transfer molding method using a tablet formed with a mixture of the glass filler and a resin.

* * * * *